(12) United States Patent
Morimoto et al.

(10) Patent No.: US 6,211,036 B1
(45) Date of Patent: Apr. 3, 2001

(54) SEMICONDUCTOR DEVICE HAVING AN IMPROVED CAPACITOR STRUCTURE, AND A METHOD OF MANUFACTURING THE SAME

(75) Inventors: Rui Morimoto; Hiroki Honda, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,698

(22) Filed: Nov. 16, 1999

Related U.S. Application Data

(62) Division of application No. 09/262,836, filed on Mar. 5, 1999, now abandoned.

(30) Foreign Application Priority Data

Sep. 4, 1998 (JP) ................................................. 10-251336

(51) Int. Cl.[7] .................................................. H01L 21/20
(52) U.S. Cl. .......................... 438/397; 438/253; 438/254
(58) Field of Search .................................. 438/254, 397, 438/253, 239, 238

(56) References Cited

U.S. PATENT DOCUMENTS

| | | |
|---|---|---|
| 5,049,957 | 9/1991 | Inoue et al. . |
| 5,095,346 | 3/1992 | Bae et al. . |
| 5,236,859 | 8/1993 | Bae et al. . |
| 5,262,663 | 11/1993 | Rho et al. . |

FOREIGN PATENT DOCUMENTS

| | | |
|---|---|---|
| 4-39964 | 2/1992 | (JP) . |
| 5-251657 | 9/1993 | (JP) . |
| 9-213906 | 8/1997 | (JP) . |

OTHER PUBLICATIONS

"A 0.4um Gate–All–Around TFT (GAT) Using a Dummy Nitride Pattern for High Density Memories", by Maegawa et al., SSDM '94, The Japan Society of Applied Physics, pp. 907–909.

Primary Examiner—Richard Elms
Assistant Examiner—Bradley K. Smith
(74) Attorney, Agent, or Firm—McDermott, Will & Emery

(57) ABSTRACT

The capacitor includes a first electrode which has a hollow structure formed by removal of a nitride film and which is formed from a conductive layer, and a second electrode which is formed from a conductive layer on the outside surface of the first electrode and on the surface of the hollow structure, while an insulating film is sandwiched between the first electrode and the second electrode. The capacitor prevents a short circuit from arising between a capacitor electrode and a wiring pattern in the proximity of the capacitor electrode in an oxide film serving as an interlayer insulating film.

5 Claims, 9 Drawing Sheets

SEMICONDUCTOR DEVICE HAVING AN IMPROVED CAPACITOR STRUCTURE, AND A METHOD OF MANUFACTURING THE SAME

This application is a Divisional of application Ser. No. 09/262,836 filed Mar. 5, 1999 now abandoned.

BACKGROUND OF THE INVENTION

1. Field of the Invention

The present invention relates to a capacitor used for a semiconductor device, such as DRAM or SRAM, and more particularly relates to a hollow capacitor and a manufacturing method therefor and further relates a semiconductor device including such capacitor.

2. Background Art

In a semiconductor device utilizing a capacitor, an increase in electrostatic capacitance is usually very important for ensuring the data-retaining characteristics of the semiconductor device. However, as semiconductor devices become progressively miniaturized, the capacitor itself is also miniaturized, thereby resulting in a decrease in the electrostatic capacitance of the capacitor.

DRAM is a representative semiconductor device utilizing such a capacitor. A capacitor having a high electrostatic capacitance has been developed for use in DRAM. A so-called cylindrical capacitor having a cylindrical electrode at one end has been conventionally used as such a capacitor having a high electrostatic capacitance. However, in the cylindrical capacitor, a thick conductive film is formed through deposition, thus increasing an absolute step between a memory cell region and a peripheral region. Such a large absolute step considerably interrupts the shape of a wiring layer and hinders miniaturization of the semiconductor device.

For these reasons, a hollow capacitor has recently been developed as a new capacitor structure. In such a hollow capacitor, one of capacitor electrodes is formed into a hollow configuration, and a dielectric film is provided on the surface of the electrode, and other electrode is disposed to face the one electrode via the dielectric film therebetween.

Such a hollow capacitor employs an oxide film as a dummy pattern to be used in forming one capacitor electrode into a hollow configuration (as disclosed in, e.g., Japanese Patent Application Laid-open Nos. 4-39964 and 9-213906 and U.S. Pat. No. 5,095,346). Isotropic etching is commonly used for removing the oxide film serving as a dummy pattern.

FIG. 11 is a cross-sectional view showing a DRAM memory cell as one example of a semiconductor device utilizing a conventional hollow capacitor.

In the drawing, reference numeral 1 designates a hollow capacitor; 2 a designates a silicon oxide film as an interlayer insulating film, 3 designates a storage node contact; 4 designates a transfer gate; 5 designates a gate electrode of the transfer gate 4; 6 designates a bit line contact; and 7 designates a bit line.

In the conventional hollow capacitor 1, an oxide film is used as a dummy pattern for forming a hollow configuration. When the oxide film is formed through isotropic etching, an oxide film, which is used as an underlying interlayer insulating film for the hollow capacitor formed on the dummy pattern, is inevitably etched away. Accordingly, the interlayer insulating film becomes thinner, thereby resulting in a risk of a short circuit arising between the electrode of the hollow capacitor 1 and the bit line 7.

FIG. 12 is a cross-sectional view showing a high-resistance SRAM memory cell having a storage node and a hollow capacitor formed for the storage node.

In the drawing, reference numeral 11 designates a substrate; 12 designates an access transistor; 13 designates a driver transistor; 15 designates a hollow capacitor; 16 designates load resistor; 17 designates a Vcc wiring pattern; 18 designates a GND line; and 19 designates a bit line.

As a result of presence of the hollow capacitor 15, the electrostatic capacitance of the storage node is increased, thereby improving the resistance of the memory cell to soft-error failures. However, the capacitor 15 is formed on a shared direct contact, so that the complete removal of the oxide film 2b staying at the shared direct contact section within a short period of time is considerably difficult. The oxide film can be completely removed, so long as the time required for removing the film (i.e., a processing time) is extended. However, the processing time cannot be extended for fear that an oxide film serving as an interlayer insulating film may be damaged.

In a conventional hollow capacitor such as that described above, an interlayer insulating film existing below the capacitor is usually an oxide film and may be substantially damaged during removal of the oxide film at the time of formation of a hollow structure. In some cases, there arises a chance of a short circuit arising between the gate electrode and the capacitor. Even if removal of an oxide film does not result in a short circuit, the flatness of the interlayer insulating film will be interrupted. This in turn distorts the shape of a film to be formed on the interlayer insulating film.

SUMMARY OF THE INVENTION

The present invention has been conceived to solve such a problem of the conventional art, and the object of the present invention is to provide a capacitor, particularly a hollow capacitor, which does not damage an oxide film serving as an interlayer insulating film. Other objects of the present invention are to provide a manufacturing method therefor, and a semiconductor device having such improved hollow capacitor.

According to one embodiment of the present invention, a semiconductor device comprises an interlayer insulation film formed on the semiconductor substrate and a capacitor formed on the interlayer insulation film. The capacitor includes a first electrode, a second electrode facing the first electrode, and a thin dielectric film formed therebetween. The first electrode has at least one hollow structure formed by removal of a nitride film filling the hollow structure. The thin dielectric film is formed on the surface of the first electrode including the surface of the hollow structure. Further, the second electrode is formed on the dielectric film facing the first electrode and filling the hollow structure.

According to another embodiment of the present invention, in a method of manufacturing a semiconductor device, an interlayer insulation film is formed on a semiconductor substrate. A nitride film is grow and patterned on the interlayer insulation film. A first conductive film is grow and patterned on the nitride film. A first electrode is formed to have hollow structure by selectively removing the nitride film by means of isotropic etching. A thin dielectric film is grown on the surface of the first electrode including the surface of the hollow structure. Further, a second conductive film is grow and patterned on the thin insulating film filling the hollow structure, and thus a second electrode is formed.

In another aspect of the present invention, in a method of manufacturing a semiconductor device, a process of growing and patterning a nitride film on a first conductive film, and a process of growing and patterning a first conductive film on the nitride film is repeated. Thereby, a first electrode having plurality hollow structures is formed. Thereafter, a thin dielectric film is grown on the surface of the first electrode including the surface of the hollow structures. Further, a second conductive film is grown and patterned on the thin insulating film filling the hollow structures, thereby a second electrode is formed.

Other and further objects, features and advantages of the invention will appear more fully from the following description.

DETAILED DESCRIPTION OF THE PREFERRED EMBODIMENTS

Figure 1:
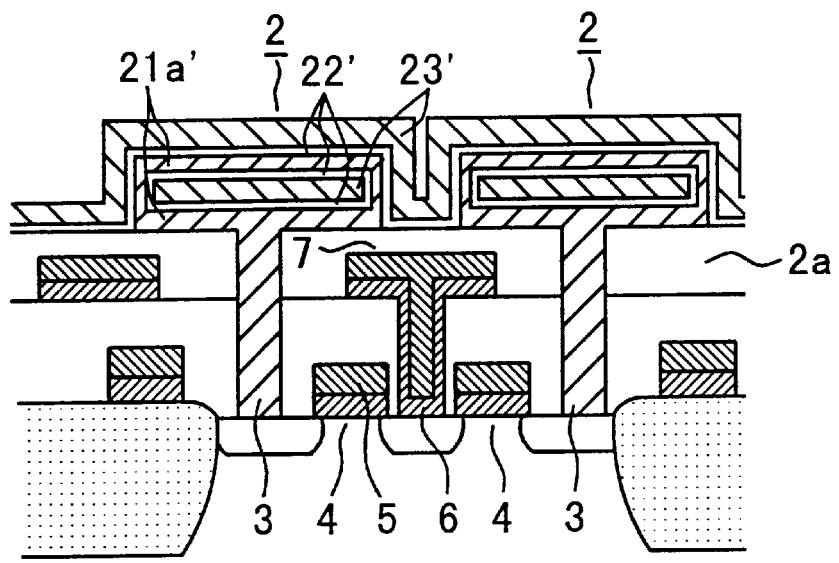
FIG. 1 is a cross-sectional view showing an example of a semiconductor device according to a first embodiment of the present invention.
Figure 11:
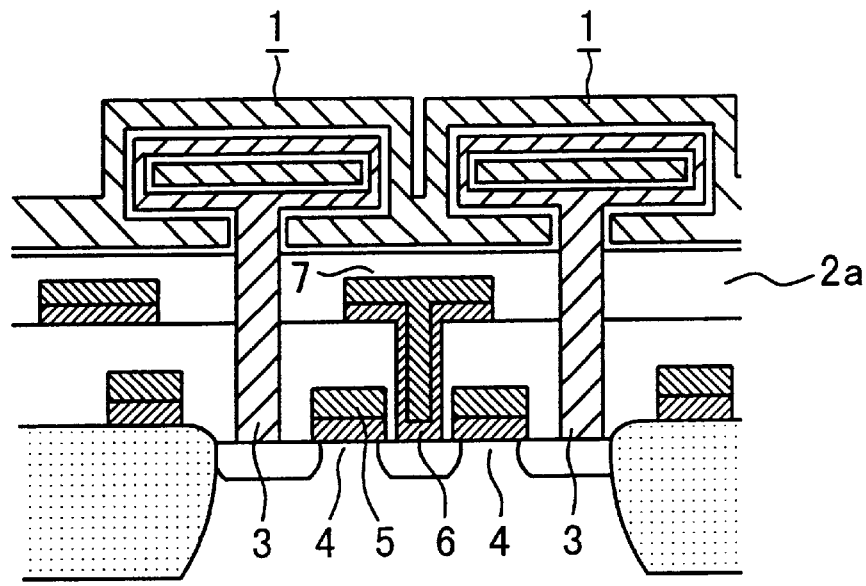
FIG. 11 is a cross-sectional view showing a conventional DRAM memory cell as one example of a semiconductor device having a conventional hollow capacitor.

Preferred embodiments of the present invention will be described hereinbelow by reference to the accompanying drawings, in which same reference numerals designate same or corresponding portions.
First Embodiment FIG. 1 is a cross-sectional view showing a semiconductor device; that is, a DRAM memory cell, according to a first embodiment to which the present invention is applied. In FIG. 1, those elements corresponding to those shown in FIG. 11 are assigned the same reference numerals, and their explanations will be provided below.

In the drawing, reference numeral 2 designates a hollow capacitor according to the first embodiment; 2a designates a silicon oxide layer as an interlayer insulating layer; 3 designates a storage node contact; 4 designates a transfer gate; 5 designates a gate electrode of the transfer gate 4; 6 designates a bit line contact; and 7 designates a bit line.

The hollow capacitor 2 comprises one electrode 21a' (a first electrode) connected to the storage node contact 3, another electrode 23' (a second electrode) and a dielectric film 22 sandwiched between the two electrodes.

One electrode 21a' of the hollow capacitor is formed into a hollow configuration. A part of the another electrode 23' is placed in the hollow configuration with the dielectric film 22' inbetween.

As will be described later, according to the present embodiment, a hollow configuration of an electrode of the hollow capacitor is formed by use of a nitride film. In general, the nitride film is isotropically etched through use of a phosphoric acid which has an etch selectivity with respect to an oxide film. Therefore, the hollow capacitor 2 is formed without damaging an oxide film 2a serving as an interlayer insulating film.

Figure 2:
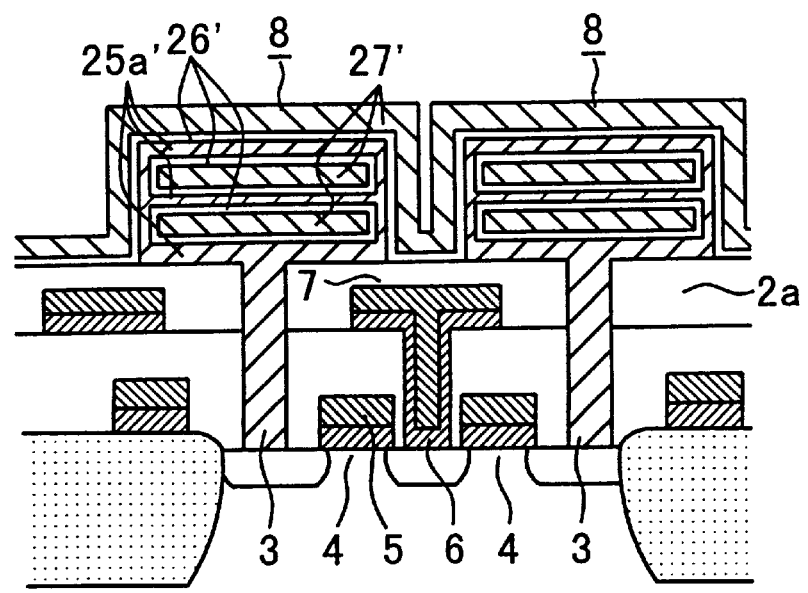
FIG. 2 is a cross-sectional view showing another example of a semiconductor device according to a second embodiment of the present invention.
Figure 3A:
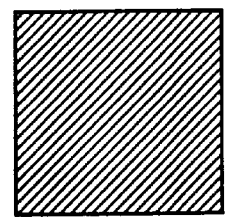
FIGS. 3A to 3D are top views, or flat figures, showing the hollow capacitors when viewed from the top.
Figure 3B:
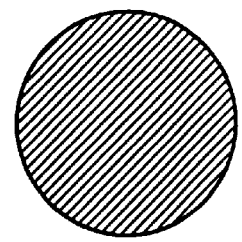
Figure 3C:
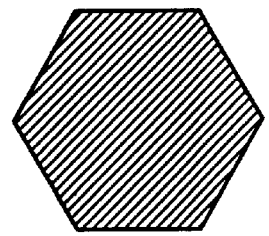
Figure 3D:
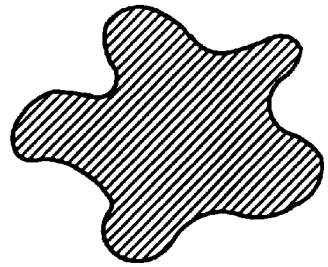

As mentioned above, according to the first embodiment, a hollow capacitor electrode is formed through use of a dummy pattern made of a nitride film. As a result, a hollow capacitor can be formed without damaging an oxide film serving as an interlayer insulating film. Further, compared with a conventional method, the manufacturing method according to the first embodiment enables considerably longer extension of the etching time required for removing the dummy pattern. Accordingly, a large hollow structure or an intricate hollow structure, which would not be implemented by the conventional method, can be formed by the manufacturing method according to the present invention.
Second Embodiment FIG. 2 is a cross-sectional view showing a second embodiment in which the present invention is applied to a semiconductor device; e.g., a DRAM memory cell, as in the case with the first embodiment. In FIG. 2, those elements, which are the same as those shown in FIG. 1, are assigned the same reference numerals, and their detailed description will be omitted here.

In the drawing, reference numeral 8 designates a hollow capacitor according to the second embodiment. The hollow capacitor 8 is formed by vertically stacking the hollow capacitors 2 according to the first embodiment and electrically connecting therebetween.

The hollow capacitor 8 comprises one electrode 25a' (a first electrode) connected to the storage node contact 3, another electrode 27' (a second electrode) and a dielectric film 26 sandwiched between the two electrodes.

One electrode 25a' of the hollow capacitor is formed into a hollow configuration. A part of the another electrode 27' is placed in the hollow configuration with the dielectric film 26' inbetween.

As a result, even in the second embodiment, an advantageous result similar to that yielded in the first embodiment will be obtained. Further, according to the second embodiment, the area of a capacitor is increased, and there is made feasible data-retaining stability against soft-error failures or against an electron injection phenomenon stemming from undershoot or a reduction in power consumption due to an extension of refresh time.
Third Embodiment FIGS. 3A to 3D are top views showing the hollow capacitors when viewed from the top.

The shape of the top of the hollow capacitor according to the present invention is not specifically limited. The top of the hollow capacitor may assume a rectangular shape shown in FIG. 3A, a circular shape shown in FIG. 3B, a polygonal shape shown in FIG. 3C, or an amebic shape (having several protuberances) shown in FIG. 3D. Alternatively, the hollow capacitor may have a top composed entirely of curves or a top composed of a combination of linear lines and curves.

Alternatively, the hollow capacitor may have a top having a hole formed therein. Further, the electrodes of the hollow capacitor having the foregoing shapes may be stacked into electrically connected layers, as in the case with the second embodiment. Further, the thus-stacked electrodes of the hollow capacitor may differ in shape from each other when viewed from the top.

As mentioned above, according to the third embodiment, the electrode of the hollow capacitor can assume substantially any arbitrary shape, thus facilitating design and manufacture of the capacitor.

Fourth Embodiment

Figure 4A:
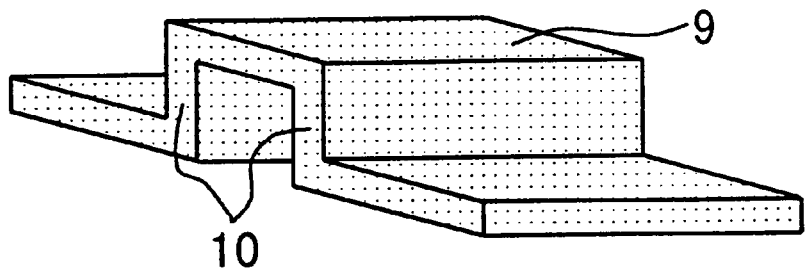
FIGS. 4A to 4C are perspective views showing a modification of the electrode of the hollow capacitor that may be applied to a semiconductor device described in FIG. 1 or FIG. 2.
Figure 4B:
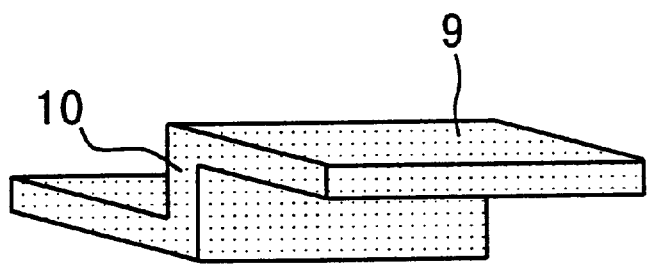
Figure 4C:
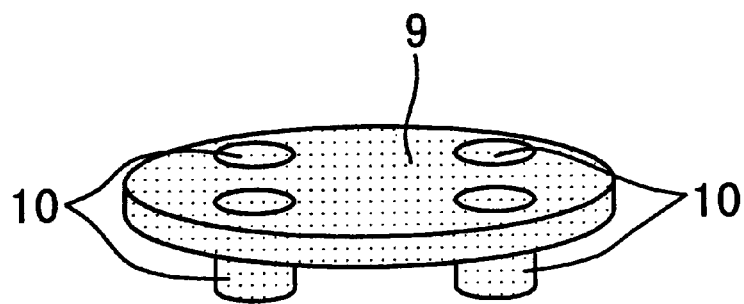

FIGS. 4A to 4C are perspective views showing a modification of the electrode of the hollow capacitor according to the first embodiment.

In the drawings, reference numeral 9 designates an upper portion of the capacitor electrode; and 10 designates a leg of the capacitor electrode. The only requirement is that the upper portion 9 of the capacitor electrode be electrically connected to the legs 10 of the capacitor electrode. The positions and shapes of the leg 10 of the capacitor electrode are not particularly specified. However, the other capacitor electrode must be formed in the hollow portion of the capacitor, and hence the hollow portion must be in communication with the outside. The capacitor electrodes of such a shape can be stacked into electrically connected layers. Further, the stacked capacitor electrodes may have legs of different shapes.

As mentioned above, according to the fourth embodiment, since the legs of the capacitor electrode are not particularly limited to specific shapes or patterns, the capacitor can be placed on a substrate in a space-efficient manner, thereby resulting in an increase in the electrostatic capacitance of the capacitor.

Fifth Embodiment

Figure 5:
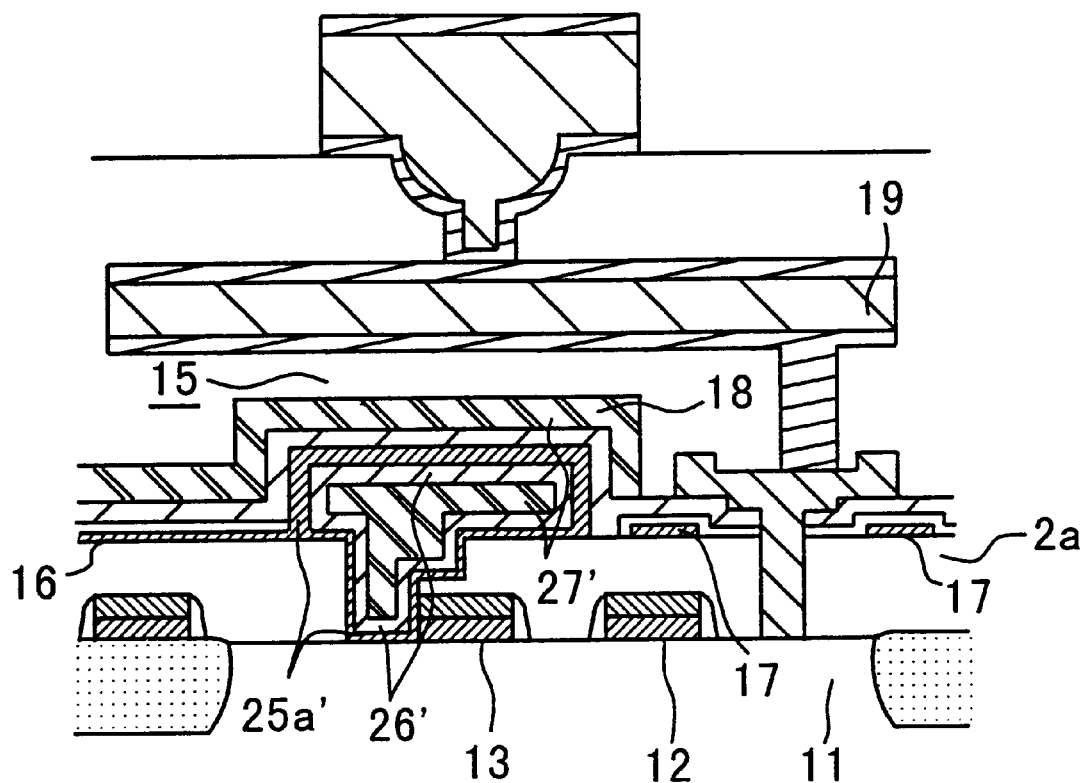
FIG. 5 is a cross-sectional view showing other example of a semiconductor device according to a fifth embodiment of the present invention.
Figure 12:
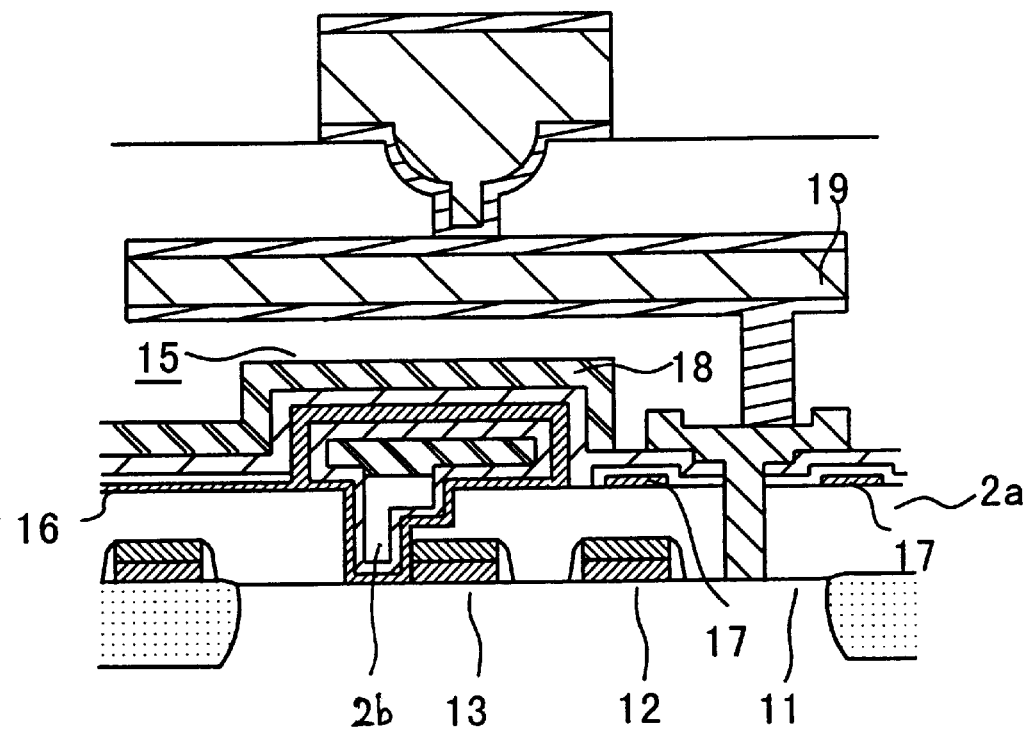
FIG. 12 is a cross-sectional view showing a conventional high-resistance SRAM memory cell having a conventional hollow capacitor.

FIG. 5 is a cross-sectional view showing a semiconductor device; that is, a SRAM memory cell, according to a fifth embodiment to which the present invention is applied. In FIG. 5, those elements corresponding to those shown in FIG. 12 are assigned the same reference numerals, and their explanations will be provided below.

In the drawing, reference numeral 11 designates a substrate; 12 designates an access transistor; 13 designates a driver transistor; 15 designates a hollow capacitor according to the fifth embodiment; 16 designates load resistor; 17 designates a Vcc wiring pattern; 18 designates a GND line; and 19 designates a bit line.

The hollow capacitor 15 comprises one electrode 25a' (a first electrode), another electrode 27' (a second electrode) and a dielectric film 26 sandwiched between the two electrodes.

One electrode 25a' of the hollow capacitor is formed into a hollow configuration. A part of the another electrode 27' is placed in the hollow configuration with the dielectric film 26' inbetween.

As in the case with the foregoing embodiment, even in the fifth embodiment, a nitride film is used as a dummy pattern to be used in forming a hollow structure of the hollow capacitor 15. Since the nitride film can be removed through use of a phosphoric acid having an etch selectivity with respect to the oxide film, there can be ensured a sufficiently long etching time.

As mentioned above, even in the fifth embodiment, a capacitor electrode of hollow structure is formed through use of a dummy pattern made of a nitride film. Hence the nitride film serving as a dummy pattern is completely removed from the hollow structure without damaging the oxide film serving as an interlayer insulating film, an increase in the capacitance of the hollow capacitor 15 is enabled.

Sixth Embodiment

FIGS. 6A to 7B are perspective views showing a process of fabricating a hollow capacitor. The process may be applied for fabricating at least a part of a hollow capacitor as described in the first embodiment.

The fabrication process will now be described with reference to the drawings.

Figure 6A:
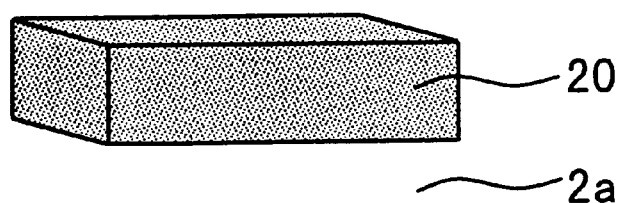
FIGS. 6A to 7B are perspective views showing a process of fabricating the hollow capacitor as described in the first embodiment.
Figure 6B:
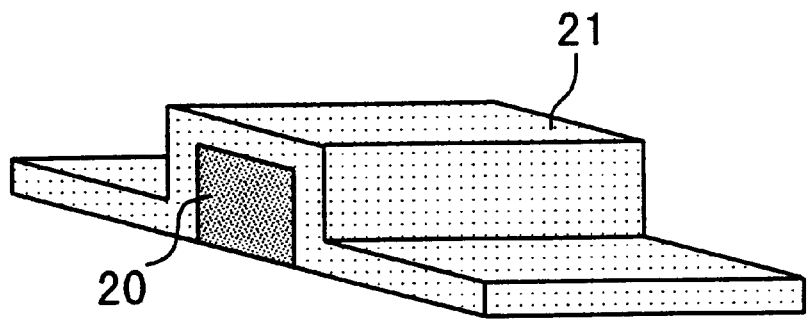
Figure 6C:
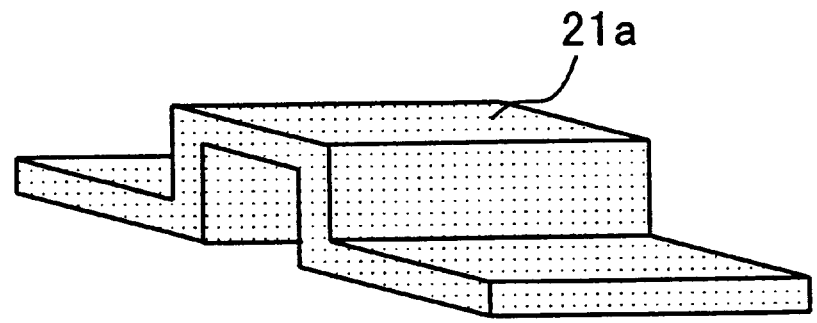

First, as shown in FIG. 6A, a nitride film is grown on a substrate or on an interlayer insulating layer 2a (silicon oxide film), and the nitride film is patterned, thereby producing a dummy pattern 20. Next, as shown in FIG. 6B, a first doped-polysilicon layer pattern 21, which will serve as a first conductive layer, is grown and patterned in such a way as to cross the dummy pattern 20. Subsequently, as shown in FIG. 6C, the dummy pattern 20 formed from a nitride film is completely removed by means of a hot phosphoric acid, thereby leaving a first hollow doped-polysilicon layer 21a, which serves as a first electrode. The hot phosphoric acid has a high etch selectivity with respect to an oxide film and does not inflict much damage on an oxide film which is exposed during removal of the dummy pattern and which serves as an interlayer insulating film.

Figure 7A:
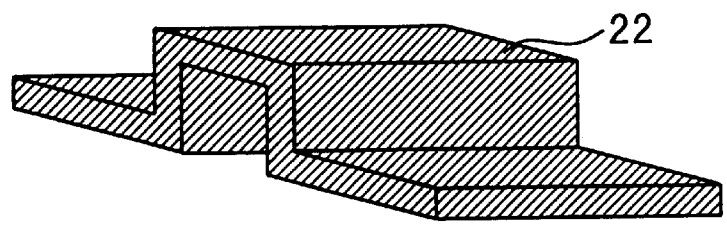
Figure 7B:
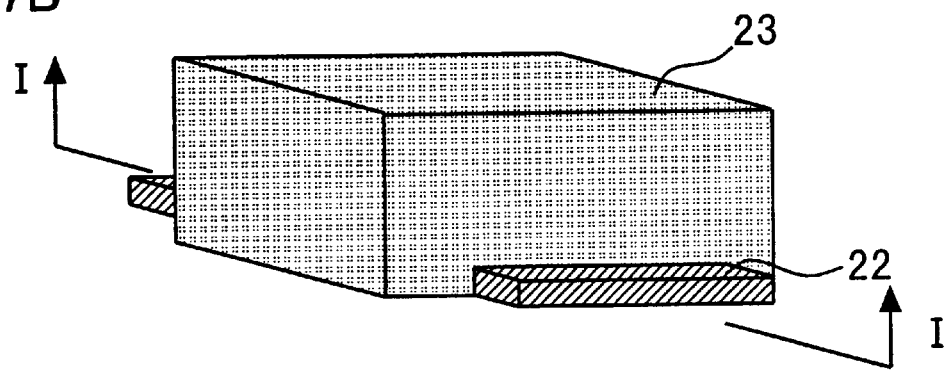

Next, as shown in FIG. 7A, a nitride film 22, which will serve as a dielectric film (or insulating film), is grown on the surface of the first hollow doped-polysilicon layer 21a by means of CVD. Although a nitride film is used in this process, any substance may be used in place of a nitride film, so long as the substance has a great dielectric constant. Finally, as shown in FIG. 7B, a second doped-polysilicon layer 23, which will serve as a second electrode, is grown by means of CVD and then patterned. Through CVD, the second doped-polysilicon layer 23 is grown isotropically with respect to the surface of the first doped-polysilicon layer 21a of hollow structure. The first doped-polysilicon layer 21a serves as one capacitor electrode, and the second doped-polysilicon layer 23 serves as another capacitor electrode. A capacitor is formed in the area where the first doped-polysilicon layer 21a is facing the second doped polysilicon layer 23 with the nitride film 22 sandwiched therebetween.

A lead electrode of the first doped-polysilicon layer 21a and a lead electrode of the second doped polysilicon layer 23 may be formed by way of a direct contact through substrate. Alternatively, the lead electrodes maybe formed through aluminum wiring patterns directly from contact holes.

As mentioned above, according to the sixth embodiment, since a dummy pattern formed from a nitride film is used at the time of formation of a hollow capacitor electrode, a hollow capacitor can be formed without inflicting much damage to the oxide film serving as an interlayer insulating film. Further, compared with the conventional method, the manufacturing method according to the present invention enables considerably long extension of the time for etching away the dummy pattern. Therefore, there can be formed a large hollow structure or an intrinsic hollow structure, which would not be implemented by the conventional method.

Meanwhile, although the structure as shown in FIG. 1 and the structure as shown in FIGS. 6–7 are not same in detail, the structure of FIG. 1 may be construed similar to the structure of FIG. 7(b) seen from the cross section along the line I—I.

The first electrode 21a' (a hollow electrode) in FIG. 1 may be formed by a similar fabricating process as the first electrode 21a in FIGS. 6–7. In the same context, the second electrode 23' or the dielectric film 22' in FIG. 1 may be formed in the similar way as the second electrode 23 or the dielectric film 22 in FIGS. 6–7.

Seventh Embodiment

FIGS. 8A to 10C are perspective views showing another process of fabricating another hollow capacitor. The process may be applied for fabricating at least a part of a hollow capacitor as described in the second embodiment.

The fabrication process will be described with reference to the drawings.

Figure 8A:
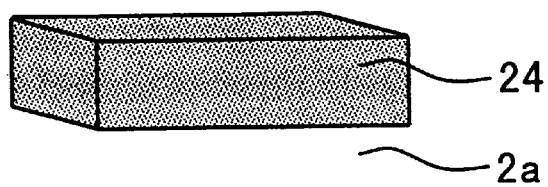
FIGS. 8A to 10C are perspective views showing a process of fabricating the hollow capacitor as described in the second embodiment.
Figure 8B:
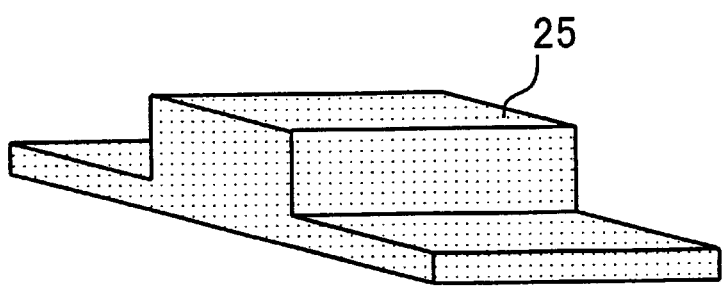
Figure 9A:
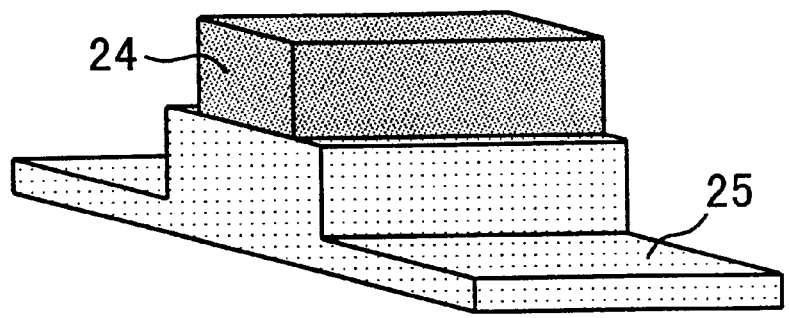
Figure 9B:
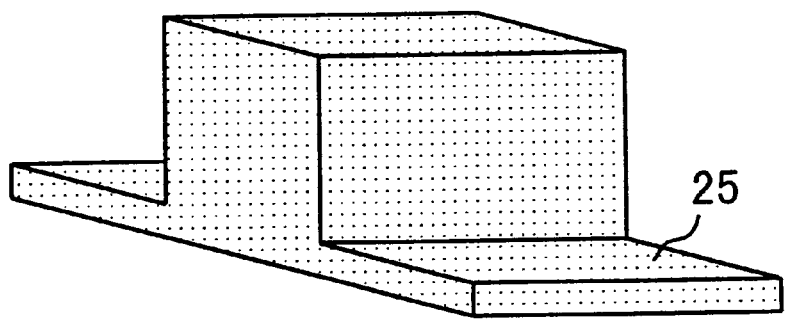
Figure 9C:
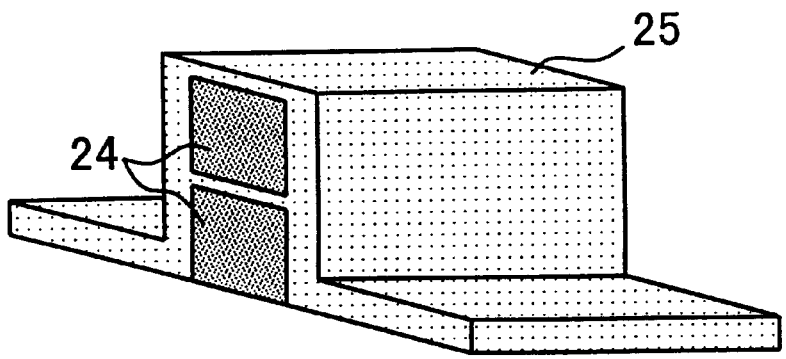

First, as shown in FIG. 8A, a nitride film is grown on a substrate or on an interlayer insulating layer 2a (silicon oxide film), and the nitride film is patterned, thereby producing a dummy pattern 24. Next, as shown in FIG. 8B, a first doped polysilicon layer pattern 25, which will serve as a first conductive layer, is grown and patterned in such a way as to cross the dummy pattern 24. These processing operations are repeated several times (FIGS. 9A to 9C). Then, the first doped polysilicon layer pattern 25 is patterned. At this time, an etch selectivity between doped polysilicon and a nitride film is made as close to unity as possible, thereby avoiding difficulties associated with etching. Subsequently, the dummy pattern 24 formed from a nitride film is completely removed by means of a hot phosphoric acid. The hot phosphoric acid has a high etch selectivity with respect to an oxide film and does not inflict much damage on an oxide film which is exposed during removal of the dummy pattern and which serves as an interlayer insulating film.

Figure 10A:
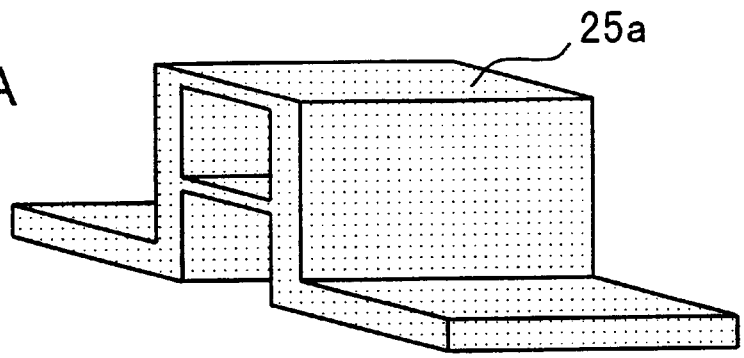
Figure 10B:
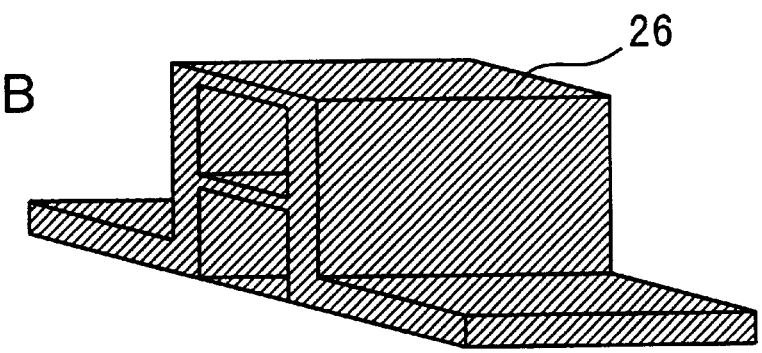

As a result, there is formed a first doped polysilicon layer 25a comprising a plurality of hollow structures vertically stacked in layers (FIG. 10A). The thus formed first doped polysilicon layer 25a serves as one of the capacitor electrodes (i.e., a first electrode). A nitride film 26, which will serve as a dielectric film (or insulating film), is grown on the surface of the first doped polysilicon layer 25a by means of CVD (FIG. 10B). As is the case with the sixth embodiment, any substance may be used as the nitride film 26, so long as the substance has a considerably high dielectric constant. Finally, as shown in FIG. 10C, a second doped polysilicon layer 27, which will serve as a second electrode, is grown by means of CVD and then patterned.

As a result, even in the seventh embodiment, an advantageous result similar to that yielded in the sixth embodiment will be yielded. Further, according to the seventh embodiment, the area of a capacitor is increased, and there is made feasible data-retaining stability against soft-error failures or against an electron injection phenomenon stemming from undershoot or a reduction in power consumption due to an extension of refresh time.

Figure 10C:
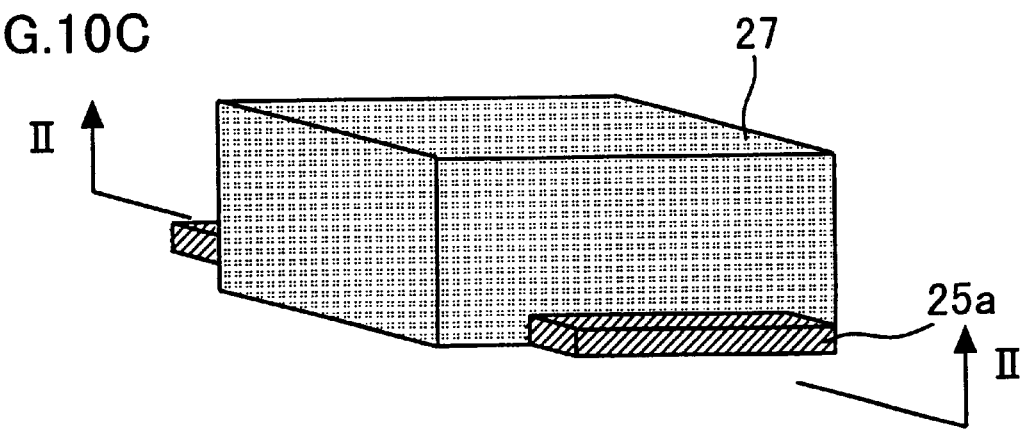

Meanwhile, although the structure as shown in FIG. 2 and the structure as shown in FIGS. 8–10 are not same in detail, the structure of FIG. 2 may be construed similar to the structure of FIG. 10(c) seen from the cross section along the line II—II.

The first electrode 25a' (a hollow electrode) in FIG. 2 may be formed by a similar fabricating process as the first electrode 25a in FIGS. 8–10. In the same context, the second electrode 27' or the dielectric film 26' in FIG. 1 may be formed in the similar way as the second electrode 27 or the dielectric film 26 in FIGS. 8–10.

Further, although the structure as shown in FIG. 5 and the structure as shown in FIGS. 8–10 are not same in detail, the structure of FIG. 5 may be construed similar to the structure of FIG. 10(c) seen from the cross section along the line II—II.

The first electrode 25a' (a hollow electrode) in FIG. 5 may be formed by a similar fabricating process as the first electrode 25a in FIGS. 8–10. In the same context, the second electrode 27' or the dielectric film 26' in FIG. 5 may be formed in the similar way as the second electrode 27 or the dielectric film 26 in FIGS. 8–10.

Eighth Embodiment

Although the foregoing embodiments have described a case where a hollow capacitor is used as a capacitor, the present invention is not limited to such a case. The present invention can be applied to any capacitor, so long as the capacitor is of a structure similar to that of the hollow capacitor. In this case, the present invention yields a similar advantageous result. Further, the semiconductor device is not limited to DRAM or SRAM; the present invention may be applied to other types of semiconductor device, e.g., a logic circuit.

The effects and advantages of the present invention may be summarized as follows.

As has been described above, according to the present invention, a capacitor comprises a first electrode having a hollow structure formed by removal of a nitride film. The capacitor further comprises a second electrode that is formed on the outside surface of the first electrode and on the inner surface of the hollow structure of the first electrode, and an insulating film is sandwiched between the first electrode and the second electrode. The present invention yields an advantage of fabricating a capacitor, which prevents a short circuit between a capacitor electrode and a wiring pattern facing to the capacitor electrode in the insulating film.

According to the present invention, the capacitor has a structure comprising the first and second electrodes vertically stacked in layers. As a result, the effective area of the capacitor is increased, and there is made feasible data-retaining stability against soft-error failures or against an electron injection phenomenon stemming from undershoot or a reduction in power consumption due to an extension of refresh time.

According to the present invention, the tops of the first and second electrodes can assume arbitrary shapes; hence, the design or fabrication of the capacitor can be facilitated.

Further, according to the present invention, since the legs electrically connected to the upper portion are not particularly limited to specific positions or patterns, the capacitor can be placed on a substrate in a space-efficient manner, thereby resulting in an increase in the electrostatic capacitance of the capacitor.

According to the present invention, in a method of manufacturing a capacitor, a hollow capacitor electrode is formed through use of a dummy pattern made of a nitride film. Therefore, an oxide film serving as an interlayer insulating film is prevented from being significantly damaged. Eventually, the stability of patterning is improved by means of the flatness of the oxide film serving as an interlayer insulating film. Further, compared with the conventional method, the manufacturing method according to the present invention enables considerably long extension of the time for etching away the dummy pattern. Therefore, there can be formed a large hollow structure or an intrinsic hollow structure, which would not be implemented by the conventional method.

According to the present invention, a phosphoric acid having a high etch selectivity with respect to an oxide film is used for removing the nitride film. Consequently, an oxide film which is exposed during removal of the dummy pattern and which serves as an interlayer insulating film is prevented from being greatly damaged.

According to the present invention, a first doped polysilicon layer is formed comprising a plurality of hollow structures vertically stacked in multiple layers to serve as one of the capacitor electrodes. A nitride film, which will serve as a dielectric film or insulating film, is grown on the surface of the first doped polysilicon layer by means of CVD. Then, a second doped polysilicon layer is grown by means of CVD filling the hollow portions of the first doped polysilicon layer to serve as a second electrode, and then patterned. Therefore, a capacitor comprising the first and second electrodes vertically stacked in multiple layers can be readily formed. As a result, the effective area of the capacitor is increased, and there is made feasible data-retaining stability against soft-error failures or against an electron injection phenomenon stemming from undershoot. Further, a reduction in power consumption may be attained due to an extension of refresh time.

Further, according to the present invention, a semiconductor device comprises an interlayer insulating film of flat structure and a capacitor formed on the interlayer insulating film. An oxide film serving as the interlayer insulating film is prevented from being greatly damaged. A short circuit can be reliably prevented from arising between a capacitor electrode and a wiring pattern, which is in proximity to the capacitor electrode and is embedded in an oxide film serving as an interlayer insulating film. Therefore, the present invention yields an advantage of manufacture of a semiconductor device having superior quality.

According to the present invention, since a capacitor is of a hollow type, there is manufactured a semiconductor device which can be miniaturized, which includes a capacitor having a large electrostatic capacitance, and superior quality.

The entire disclosure of a Japanese Patent Application No. 10-251336, filed on Sep. 4, 1998 including specification, claims, drawings and summary, on which the Convention priority of the present application is based, are incorporated herein by reference in its entirety.

Obviously many modifications and variations of the present invention are possible in the light of the above teachings. It is therefore to be understood that within the scope of the appended claims the invention may by practiced otherwise than specifically described.

What is claimed is:

1. A method of manufacturing a semiconductor device comprising the steps of:

forming an interlayer insulation film on a semiconductor substrate;

growing and patterning a nitride film directly on said interlayer insulation film;

growing and patterning a first conductive film on said nitride film;

forming a first electrode having a hollow structure by selectively removing said nitride film by means of isotropic etching;

growing a thin dielectric film on the surface of said first electrode including the surface of said hollow structure; and growing and patterning a second conductive film on said thin insulating film filling said hollow structure thereby to form a second electrode.

2. The method of manufacturing a semiconductor device according to claim 1, wherein a phosphoric acid having a high etch selectivity with respect to an oxide film is used for removing said nitride film.

3. A method of manufacturing a semiconductor device comprising the steps of:

forming an interlayer insulation film on a semiconductor substrate;

growing and patterning a first nitride film directly on said interlayer insulation film;

growing and patterning a first conductive film on said nitride film;

growing and patterning a second nitride film on said first conductive film;

growing and patterning another first conductive film on said second nitride film;

forming a first electrode having a plurality hollow structures by selectively removing said plurality of nitride films by means of isotropic etching;

growing a thin dielectric film on the surface of said first electrode including the surface of said hollow structures;

growing and patterning a second conductive film on said thin insulating film filling said hollow structures thereby to form a second electrode.

4. A method of manufacturing a semiconductor device according to claim 3, wherein a step of growing and patterning the second nitride film on the first conductive film; and a step of growing and patterning the other first conductive film on said second nitride film is repeated a predetermined number of times, following the step of growing and patterning the another first conductive film on said second nitride film, and prior to the step of forming the first electrode having a plurality of hollow structures by selectively removing said plurality of nitride films by means of isotropic etching.

5. The method of manufacturing a semiconductor device according to claim 3, wherein a phosphoric acid having a high etch selectivity with respect to an oxide film is used for removing said nitride films.

* * * * *